(12) United States Patent
Pelloie

(10) Patent No.: US 10,503,859 B2
(45) Date of Patent: Dec. 10, 2019

(54) INTEGRATED CIRCUIT DESIGN AND/OR FABRICATION

(71) Applicant: ARM Limited, Cambridge (GB)

(72) Inventor: Jean-Luc Pelloie, Isère (FR)

(73) Assignee: ARM Limited, Cambridge (GB)

(*) Notice: Subject to any disclaimer, the term of this patent is extended or adjusted under 35 U.S.C. 154(b) by 49 days.

(21) Appl. No.: 15/690,603

(22) Filed: Aug. 30, 2017

(65) Prior Publication Data

US 2019/0065650 A1    Feb. 28, 2019

(51) Int. Cl.
*G06F 17/50* (2006.01)
*H01L 27/02* (2006.01)

(52) U.S. Cl.
CPC ...... *G06F 17/5072* (2013.01); *G06F 17/5077* (2013.01); *H01L 27/0207* (2013.01)

(58) Field of Classification Search
USPC ........................................................ 716/119
See application file for complete search history.

(56) References Cited

U.S. PATENT DOCUMENTS

| | | | | |
|---|---|---|---|---|
| 2009/0055793 A1* | 2/2009 | Melzner | ............ | G06F 17/5077 |
| | | | | 716/130 |
| 2009/0217228 A1* | 8/2009 | Melzner | ............ | G06F 17/5077 |
| | | | | 716/122 |
| 2011/0145775 A1* | 6/2011 | Sano | ............ | G06F 17/5068 |
| | | | | 716/122 |
| 2012/0192135 A1* | 7/2012 | Gullette | ............ | G06F 17/5081 |
| | | | | 716/113 |

* cited by examiner

*Primary Examiner* — Bryce M Aisaka
(74) *Attorney, Agent, or Firm* — Nixon & Vanderhye P.C.

(57) ABSTRACT

A computer-implemented method of generating a layout of a circuit block of an integrated circuit comprises: receiving input data defining a logical operation of the circuit block; accessing a cell library providing a plurality of candidate cells; determining, with reference to the input data, a set of cells to be used to implement the circuit block, the cells defining circuit elements for fabrication on a substrate; and generating the layout by employing a place and route tool to determine a placement of the set of cells and performing a routing operation to interconnect interface terminals of the set of cells by determining routing paths to be provided within a plurality of metal layers including a lowest metal layer overlying the cells and within which interface terminals of the cells are provided and one or more further metal layers overlying the lowest metal layer; in which the step of determining routing paths comprises determining a routing path between interface terminals of a group of two or more cells by providing, in the generated layout, (i) an interconnection overlying the interface terminals of the group of two or more cells in one of the one or more further metal layers and (ii) via connections between the interconnection and the interface terminals of the group of two or more cells.

22 Claims, 17 Drawing Sheets

| Row 4 | CELL1_M1_M2 | CELL2_M1_M2 | CELL4_M1_M2 | CELL3_M2 | |
|---|---|---|---|---|---|
| Row 3 | CELL4 | CELL3_M1 | | CELL2 | CELL1_M1 |
| Row 2 | CELL3_M1_M2 | | CELL4_M2 | CELL2_M2 | CELL1_M2 |
| Row 1 | CELL1 | CELL2_M1 | | CELL3 | CELL4_M1 |

FIG. 19

INTEGRATED CIRCUIT DESIGN AND/OR FABRICATION

BACKGROUND

Technical Field

The present disclosure relates to integrated circuit design, for example to techniques for generating the layout of a circuit block for such an integrated circuit. The circuit block may represent the entire integrated circuit or a component within the integrated circuit. The disclosure may also encompass fabricating an integrated circuit designed using these techniques.

In the design of semiconductor integrated circuits, it is known to provide automated tools which use a functional design of a planned circuit block identifying the logical operation that that circuit block is to perform (for example in the form of a gate level netlist or a Register Transfer Level representation of the design) and a cell library providing a set of cells (the cells defining circuit elements, and being "building blocks" for putting together the layout of the circuit block according to the functional design) in order to generate the layout of the circuit block.

In particular, the automated tool may take the form of a so-called place and route tool which places the required cells within an overall layout or "floorplan" and then performs a routing operation to determine routing paths to be provided within a number of metal layers in order to interconnect the various cells, so that collectively the cells will perform the required logical operation of the circuit block.

As the complexity of the required circuit blocks increases, it is becoming more and more difficult to accommodate all of the required routing paths within the available metal layers, and it is sometimes the case that the area required for the circuit block may be larger than it would otherwise need to be, so as to provide sufficient space for all of the various routing paths to be provided.

Accordingly, it would be desirable to provide improved techniques for accommodating the required routing paths within the layout of a circuit block.

SUMMARY

In an example arrangement there is provided a computer-implemented method of generating a layout of a circuit block of an integrated circuit, comprising:

receiving input data defining a logical operation of the circuit block;

accessing a cell library providing a plurality of candidate cells;

determining, with reference to the input data, a set of cells to be used to implement the circuit block, the cells defining circuit elements for fabrication on a substrate; and generating the layout by employing a place and route tool to determine a placement of the set of cells and performing a routing operation to interconnect interface terminals of the set of cells by determining routing paths to be provided within a plurality of metal layers including a lowest metal layer overlying the cells and within which interface terminals of the cells are provided and one or more further metal layers overlying the lowest metal layer;

in which the step of determining routing paths comprises determining a routing path between interface terminals of a group of two or more cells by providing, in the generated layout, (i) an interconnection overlying the interface terminals of the group of two or more cells in one of the one or more further metal layers and (ii) via connections between the interconnection and the interface terminals of the group of two or more cells.

In another example arrangement there is provided a computer-implemented method of generating a layout of a circuit block of an integrated circuit, comprising:

receiving input data defining a logical operation of the circuit block;

accessing a cell library providing a plurality of candidate cells;

determining, with reference to the input data, a set of cells to be used to implement the circuit block, the cells defining circuit elements for fabrication on a substrate; and generating the layout by employing a place and route tool to determine a placement of the set of cells and performing a routing operation to interconnect interface terminals of the set of cells by determining routing paths to be provided within a plurality of metal layers including a lowest metal layer overlying the cells and within which interface terminals of the cells are provided and one or more further metal layers overlying the lowest metal layer;

in which the step of determining routing paths comprises determining a routing path between interface terminals of a group of two or more cells by providing, in the generated layout, an interconnection between the interface terminals within the lowest metal layer.

In another example arrangement there is provided a computer-implemented method of generating a layout of a circuit block of an integrated circuit, comprising:

receiving input data defining a logical operation of the circuit block;

accessing a cell library providing a plurality of candidate cells, each cell having an associated representation defining respective cell formations within respective ones of a plurality of metal layers for fabrication using at least two spatially offset mask patterns;

determining, with reference to the input data, a set of cells to be used to implement the circuit block, the cells defining circuit elements for fabrication on a substrate, the set of cells comprising at least two rows of cells in which cells in a row of cells are spatially inverted relative to cells in an adjacent row of cells; and generating the layout by employing a place and route tool to determine a placement of the set of cells;

in which:

the generating step comprises generating a layout in which the spatially offset mask patterns are aligned with a routing grid defined with respect to the substrate; and the step of determining a set of cells comprises selecting, amongst groups of electrically equivalent candidate cells in which, for a group of electrically equivalent cells, the circuit functionality is the same but the respective cell formations are interchanged amongst the at least two spatially offset mask patterns.

In another example arrangement there is provided a non-transitory storage medium storing a cell library comprising a plurality of candidate cells that define circuit elements, the cell library providing one or more groups of electrically equivalent candidate cells in which, for a group of electrically equivalent cells, the circuit functionality is the same but the layout of interface terminals differs between the electrically equivalent cells.

In another example arrangement there is provided a non-transitory storage medium storing a cell library comprising a plurality of candidate cells that define circuit elements, the cell library providing one or more groups of electrically equivalent candidate cells in which, for a group of electrically equivalent cells, the circuit functionality is the same but the respective cell formations are interchanged amongst at least two spatially offset mask patterns.

Further aspects, features and advantages of the present technique will be apparent from the following description of examples, which is to be read in conjunction with the accompanying drawings.

BRIEF DESCRIPTION OF THE DRAWINGS

The present technique will be described further, by way of example only, with reference to embodiments thereof as illustrated in the accompanying drawings, in which:

FIG. 19 schematically illustrates multiple rows of cells;

DESCRIPTION OF EMBODIMENTS

Figure 1:
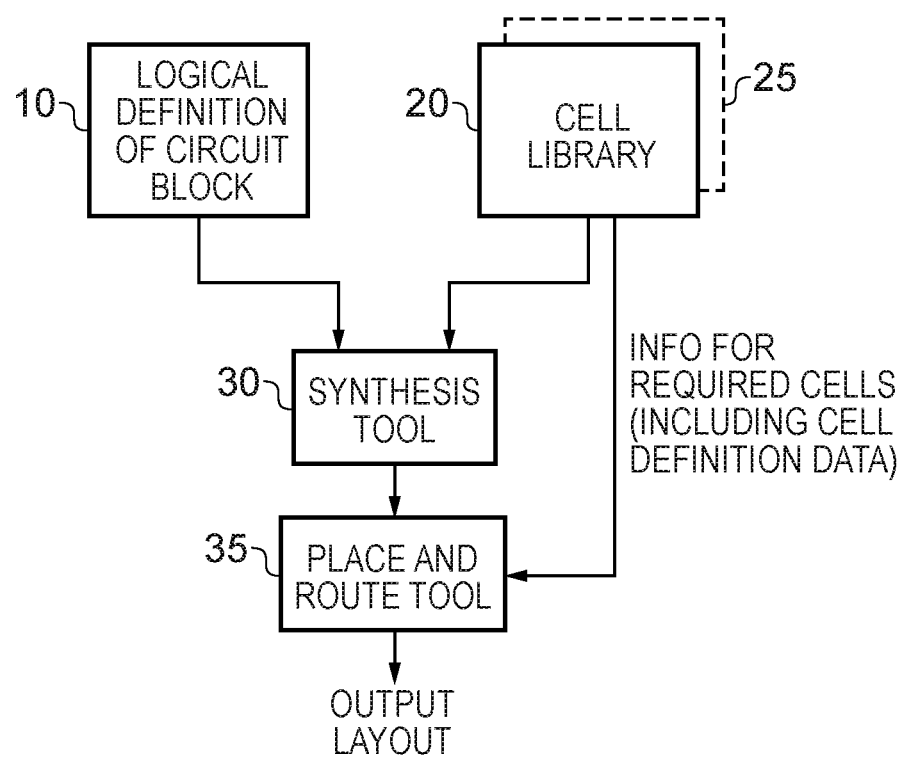
FIG. 1 is a block diagram schematically illustrating components used when generating the layout of a circuit block in accordance with one embodiment.

Before discussing the embodiments with reference to the accompanying figures, the following description of embodiments is provided.

As the processes used to manufacture integrated circuits shrink to ever smaller geometries, this can cause a number of design constraints to be enforced in order to ensure that satisfactory yield levels can be obtained by the foundries manufacturing the integrated circuits. For instance, in advanced CMOS processes, design rules may be imposed on one or more of the metal layers used in the manufacture of integrated circuits. For example, it is known to impose design rules on the first or lowest metal layer, referred to as the metal zero (M0) layer, to ensure that a regular grid pattern is observed within the M0 layer. In particular, the design rules may require metal sections to be provided on a regular grid and fully occupy the assigned tracks of the grid, other than where cuts are made to isolate particular metal sections. This design rule constraint often means that, in addition to the metal sections required by the cell to form power nets, internal nets, or input and output pins, additional superfluous metal sections may be provided. Typically, when the final integrated circuit is manufactured, such superfluous metal sections are left in an electrically floating state.

As the circuit blocks increase in complexity, so the complexity of routing paths required increases, and this can make the task of providing all of the required routing paths within the available metal layers potentially complex.

An example embodiment provides a computer-implemented method of generating a layout of a circuit block of an integrated circuit, comprising:

receiving input data defining a logical operation of the circuit block;

accessing a cell library providing a plurality of candidate cells;

determining, with reference to the input data, a set of cells to be used to implement the circuit block, the cells defining circuit elements for fabrication on a substrate; and generating the layout by employing a place and route tool to determine a placement of the set of cells and performing a routing operation to interconnect interface terminals of the set of cells by determining routing paths to be provided within a plurality of metal layers including a lowest metal layer overlying the cells and within which interface terminals of the cells are provided and one or more further metal layers overlying the lowest metal layer;

in which the step of determining routing paths comprises determining a routing path between interface terminals of a group of two or more cells by providing, in the generated layout, (i) an interconnection overlying the interface terminals of the group of two or more cells in one of the one or more further metal layers and (ii) via connections between the interconnection and the interface terminals of the group of two or more cells.

The example embodiments provide an elegantly convenient way of routing interconnections between interface terminals in a lowest metal layer by using an interconnection in a higher metal layer. For example, the higher layer may be a second-lowest metal layer (such as metal 1 (M1)) overlying the lowest metal layer. Alternatively, the providing step comprises providing at least a part of the interconnection in another of the further metal layers (such as M2, M3 or the like) overlying the second-lowest metal layer.

In example arrangements, the interface terminals comprise input terminals and output terminals; and for the group of two or more cells, the routing path is between at least one input terminal and at least one output terminal. It is noted that the arrangements are not restricted to one cell's output terminal connecting to one other cell's input terminal; the routing could be one to many or many to one.

In some examples, the step of determining routing paths comprises determining a routing path between interface terminals of a group of two or more cells by providing, in the generated layout, (i) an interconnection overlying an interface terminal of the group of two or more cells in one of the one or more further metal layers (ii) a via connection between the interconnection and the interface terminals of the group of two or more cells; and (iii) one or more inhibited regions spatially separated from the interconnection in which the routing of connections to the interface terminal is inhibited. This can help to avoid excessive path length (and associated resistance) between the routed point and another routing point.

In some examples, the interface terminals in the lowest metal layer are elongate regions subject to a design constraint imposing a minimum separation of a via connection from an end of one of the elongate regions; interconnections within the second-lowest metal layer are elongate regions; the elongate regions in the first metal layer and the second-lowest metal layer are in orthogonal directions; and the providing step comprises providing a via connection offset from a central longitudinal axis of an interconnection in the second-lowest metal layer so as not to violate the design constraint.

The routing process can be facilitated when the plurality of candidate cells comprises one or more groups of electrically equivalent candidate cells in which, for a group of electrically equivalent cells, the circuit functionality is the same but the layout of interface terminals differs between the electrically equivalent cells. In such arrangements, the step of determining a set of cells can comprise selecting, for a given cell having a required cell functionality, one of a group of electrically equivalent cells providing that required cell functionality taking into account the routing of a routing path between interface terminals of the given cell and one or more other cells.

In example embodiments the lowest metal layer is a metal 0 (M0) layer.

Another example embodiment provides a computer-implemented method of generating a layout of a circuit block of an integrated circuit, comprising:

receiving input data defining a logical operation of the circuit block;

accessing a cell library providing a plurality of candidate cells;

determining, with reference to the input data, a set of cells to be used to implement the circuit block, the cells defining circuit elements for fabrication on a substrate; and generating the layout by employing a place and route tool to determine a placement of the set of cells and performing a routing operation to interconnect interface terminals of the set of cells by determining routing paths to be provided within a plurality of metal layers including a lowest metal layer overlying the cells and within which interface terminals of the cells are provided and one or more further metal layers overlying the lowest metal layer;

in which the step of determining routing paths comprises determining a routing path between interface terminals of a group of two or more cells by providing, in the generated layout, an interconnection between the interface terminals within the lowest metal layer.

The example embodiments provide an elegantly convenient way of routing interconnections between interface terminals in a lowest metal layer (such as M0) by using an interconnection within the lowest metal layer.

In example arrangements, the interface terminals in the lowest metal layer are elongate regions in a predetermined orientation. In such arrangements the interconnection can comprise an elongate region in the lowest metal layer between an interface terminal at a lateral edge, with respect to the predetermined orientation, of a cell and an interface terminal at a lateral edge of a next-adjacent cell.

In other examples, so-called filler cells can be used as part of the routing. In such examples, the plurality of candidate cells comprises at last one filler cell providing cell spacing and at least power rail continuity, the filler cell defining elongate filler regions in the lowest metal layer in the predetermined orientation; in which the step of determining routing paths comprises providing, in the generated layout, an interconnection within the lowest metal layer between the interface terminals and one or more elongate filler region of an intervening filler cell.

In other examples, the lowest metal layer can be used for routing in conjunction with one or more other layers. For example, the step of determining routing paths may comprise: providing, in the generated layout, an interconnection within the lowest metal layer between an interface terminal of one of the pair of cells and a first one of the one or more elongate filler region of an intervening filler cell within the lowest metal layer; providing, in the generated layout, an interconnection within the lowest metal layer between an interface terminal of the other of the pair of cells and a second, different, one of the one or more elongate filler region of the intervening filler cell within the lowest metal layer; and providing, in the generated layout, an interconnection within another metal layer other than the lowest metal layer between the first and second elongate filler regions.

To facilitate the layout and routing, in example arrangements the plurality of candidate cells comprises one or more groups of electrically equivalent candidate cells in which, for a group of electrically equivalent cells, the circuit functionality is the same but the layout of interface terminals differs between the electrically equivalent cells. In such examples, the step of determining a set of cells may comprise selecting, for a given cell having a required cell functionality, one of a group of electrically equivalent cells providing that required cell functionality taking into account the routing of a routing path between interface terminals of the given cell and one or more other cells.

Another example embodiment provides a computer-implemented method of generating a layout of a circuit block of an integrated circuit, comprising:

receiving input data defining a logical operation of the circuit block;

accessing a cell library providing a plurality of candidate cells, each cell having an associated representation defining respective cell formations within respective ones of a plurality of metal layers for fabrication using at least two spatially offset mask patterns;

determining, with reference to the input data, a set of cells to be used to implement the circuit block, the cells defining circuit elements for fabrication on a substrate, the set of cells comprising at least two rows of cells in which cells in a row of cells are spatially inverted relative to cells in an adjacent row of cells; and generating the layout by employing a place and route tool to determine a placement of the set of cells;

in which:

the generating step comprises generating a layout in which the spatially offset mask patterns are aligned with a routing grid defined with respect to the substrate; and the step of determining a set of cells comprises selecting, amongst groups of electrically equivalent candidate cells in which, for a group of electrically equivalent cells, the circuit functionality is the same but the respective cell formations are interchanged amongst the at least two spatially offset mask patterns.

The example arrangements allow for cells to be placed in adjacent rows, even when the mask patterns may not be aligned with the row boundaries.

Although more than two mask patterns may be defined, in example arrangements a given candidate cell defines respective cell formations within a plurality of metal layers for fabrication using two spatially offset mask patterns.

The placing and routing tool (for example) may be arranged, for a given candidate cell, to generate an electrically equivalent candidate cell by interchanging the mask patterns applicable to respective cell formations. In alternative arrangements, the plurality of candidate cells comprises one or more groups of the electrically equivalent candidate cells.

In respect of any of the above methods, another example embodiment provides the steps of: incorporating the layout of the circuit block within a layout of an integrated circuit; and manufacturing the integrated circuit from the layout of the integrated circuit. Another example embodiment provides an integrated circuit manufactured according to such a method.

In respect of any of the above methods, another example embodiment provides a computer program product on a non-transitory storage medium for controlling a computer to perform a method of generating a layout of a circuit block as defined above.

Another example embodiment provides a non-transitory storage medium storing a cell library comprising a plurality of candidate cells that define circuit elements, the cell library providing one or more groups of electrically equivalent candidate cells in which, for a group of electrically equivalent cells, the circuit functionality is the same but the layout of interface terminals differs between the electrically equivalent cells.

Another example embodiment provides a non-transitory storage medium storing a cell library comprising a plurality of candidate cells that define circuit elements, the cell library providing one or more groups of electrically equivalent candidate cells in which, for a group of electrically equivalent cells, the circuit functionality is the same but the respective cell formations are interchanged amongst at least two spatially offset mask patterns.

Particular embodiments will now be described with reference to the Figures.

FIG. 1 is a block diagram illustrating components used in one embodiment to generate a layout of a circuit block. A logical definition 10 of the circuit block is provided. This may take a variety of forms, such as a gate level netlist or an RTL representation of a functional design of a planned circuit block, hence identifying the logical operation of the circuit block. This logical definition 10 is provided to a computer-implemented synthesis tool 30 which transforms the logical definitions into data for layout and also has access to one or more cell libraries 20, 25. Each of the cell libraries will provide a plurality of cells, and each individual cell can specify the layout of an associated circuit element. The size and complexity of the associated circuit element will vary dependent on the type of cells within the cell library. For example, individual cells may define basic building block structures such as NAND gates, NOR gates, or the like, or may define more complicated circuit elements comprising a larger number of interconnected transistors. Further, the cells may be custom cells, or may be standard cells.

Figure 2:
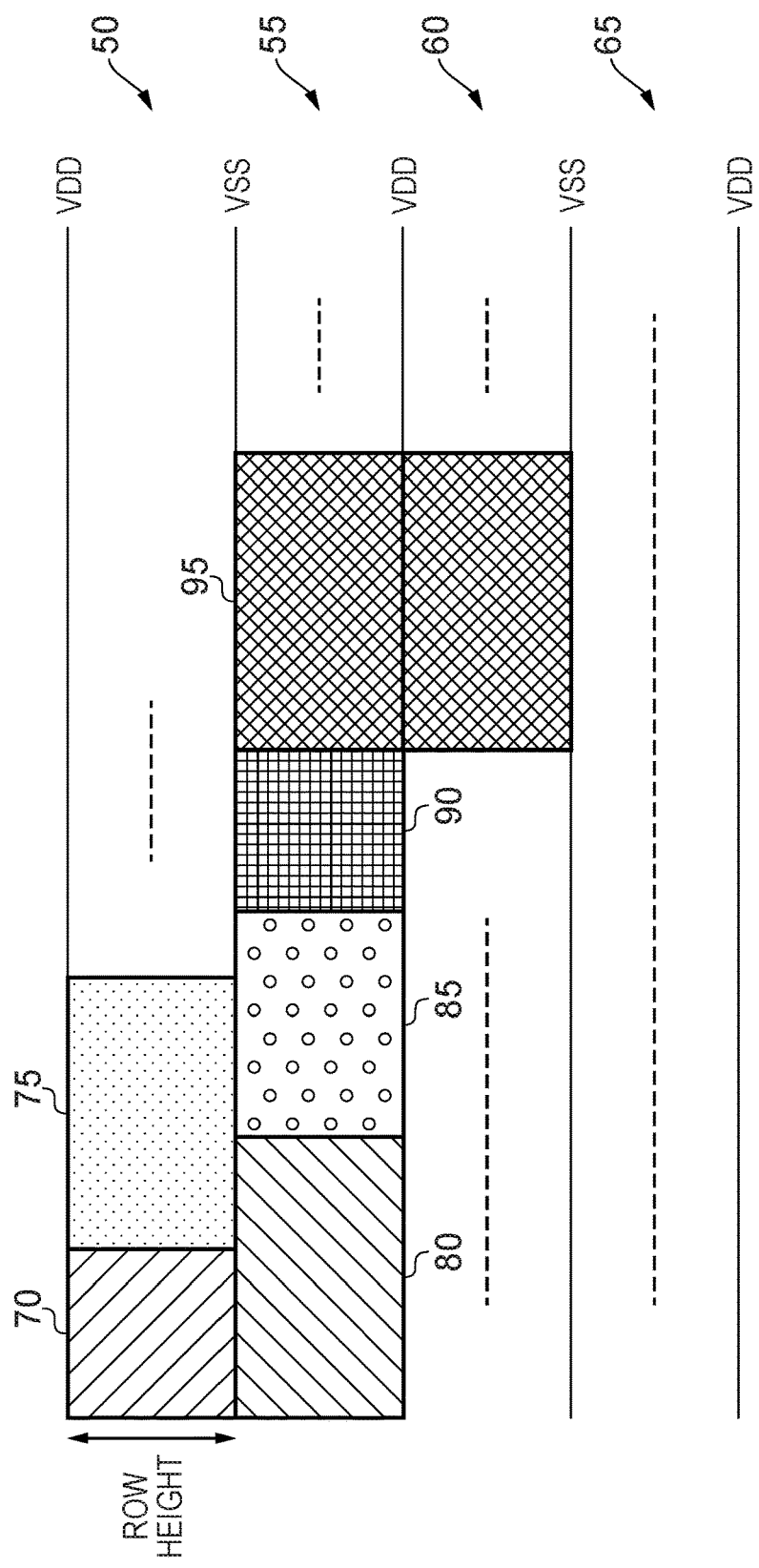
FIG. 2 schematically illustrates placement of standard cells within standard cell rows in accordance with one embodiment.

As will be appreciated by those of ordinary skill in the art, when standard cells are used, they can be laid out within a floorplan considered to comprise a plurality of standard cell rows, each with a common row height, as illustrated schematically in FIG. 2. In particular, a plurality of standard cell rows 50, 55, 60, 65 may be positioned within the floorplan; individual standard cells 70, 75, 80, 85, 90, 95 can be placed within those rows by a place and route tool and then interconnected to provide the required logical operation of the circuit block. Not all cells need be active cells that require interconnecting. For example some cells may be inactive cells, such as filler cells (non-functional cells providing spacing and power rail continuity) or cells implementing decoupling capacitors. Each standard cell is constrained to have a height equal to the row height (as in the example of standard cells 70, 75, 80, 85, 90) or a multiple of the row height (as in the example of the double-height standard cell 95 shown in FIG. 2).

Whilst the use of standard cells can simplify the place and route operations performed when designing the layout of the circuit block, it is not a requirement for standard cells to be used, and in other embodiments at least one cell library 20, 25 available to the synthesis tool 30 may comprise a library of custom cells that are not constrained to conform to a particular row height.

The synthesis tool 30 receives the logical definition 10 of the circuit block, and determines with reference to the available cell library, or cell libraries, the cells that are to be used in order to construct the required functionality of the circuit block. The synthesis operation 30 performed by the synthesis tool in FIG. 1 is performed in a standard manner and accordingly is not discussed in any further detail here. Once the synthesis operation has been performed, the output is passed to a place and route tool 35, this output identifying the cells to be used and the manner in which those cells need to be interconnected in order to produce circuitry performing the required logical operation of the circuit block.

Figure 3:
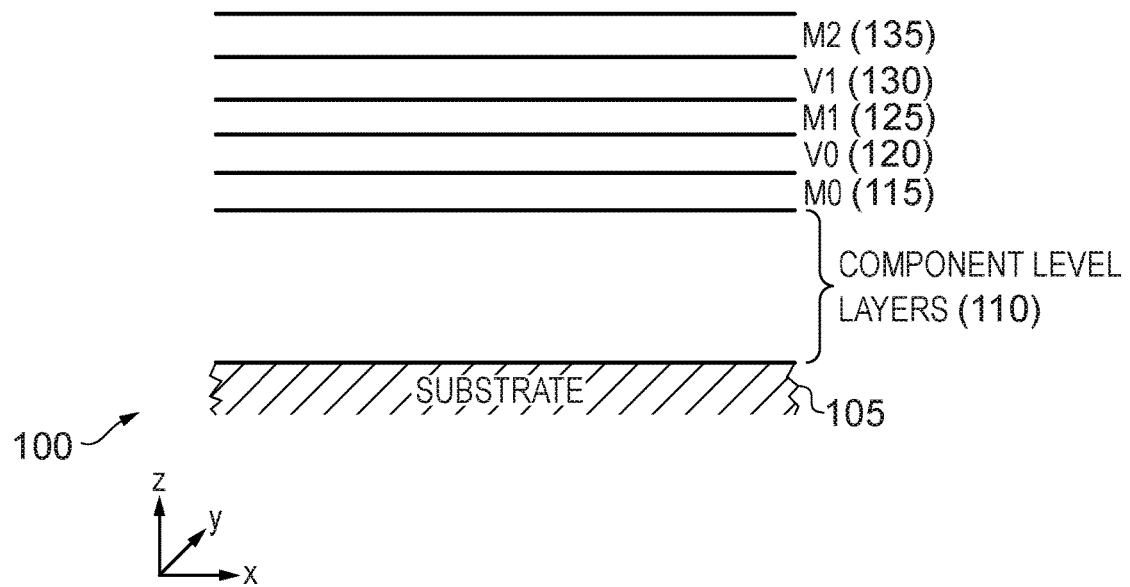
FIG. 3 schematically illustrates the various metal layers and associated via layers that may be provided in one embodiment.

The place and route tool 35 then generates the circuit layout by determining a placement of the various cells identified by the synthesis tool and performing a routing operation to determine routing paths to be provided within a plurality of metal layers in order to interconnect those cells so that they will perform the required logical operation of the circuit block. FIG. 3 is a cross section elevation view showing schematically the various metal layers that may be provided in example embodiments. Whereas the floorplan layout in FIG. 2 can be considered to extend in the x and y dimensions, the elevation shown in FIG. 3 extends in the z dimension. On a substrate 105 a number of component level layers 110 are provided in order to form the structural components forming the circuit element(s) of the cell. Hence, within the component level layers the various transistors will for example be formed. The metal zero (M0) layer 115 then accommodates a number of metal sections that will be used to provide power to the components of the cell, and to form input and output pins to be connected to the routing paths (mentioned above) by the place and route tool. In addition, some metal sections may be internal metal sections, also referred to herein as internal nets, used to interconnect different components within the component level layers 110, but which remain isolated from the routing paths provided in the various metal layers.

As shown in FIG. 3, a number of metal layers and intervening via layers may be provided above the component level layers. In this particular example, two additional metal layers are provided above the M0 layer, referred to herein as the metal one (M1) layer 125 and the metal two (M2) layer 135. Each metal layer is connected to an adjacent metal layer by metal via connections provided within the intervening via layers V0 and V1 120, 130 shown in FIG. 3. Whilst only three metal layers are shown in FIG. 3, it will be appreciated that in other embodiments additional metal layers may also be provided.

In some instances, the cells will define the metal sections of the M0 layer 115, but will not define any metal sections at higher metal layers. However, this is not a requirement and more complex cells may define one or more metal sections at higher metal layers, for example the M1 layer 125 and/or the M2 layer 135. In either case, the subsequent M1 and M2 metals layers 125, 135 are then used for routing paths to interconnect the various cells.

As will be understood by those of ordinary skill in the art, the metal sections in the adjacent metal layers typically run in perpendicular directions. For example, if the metal sections in the M0 layer 115 are considered to extend in the x dimension, then the metal sections in the M1 layer 125 will extend in the y dimension, whilst metal sections in the M2 layer 135 will extend in the x dimension. Metal connections in the via layers 120, 135 will then extend in the z dimension between the adjacent metal layers in order to connect metal sections in one layer with metal sections in the adjacent layer. The place and route tool is responsible for performing a routing operation to determine how to use the various metal layers to produce the necessary routing paths to interconnect the cells as required to bring about the functionality of the circuit block specified by the logical definition 10.

Figure 4:
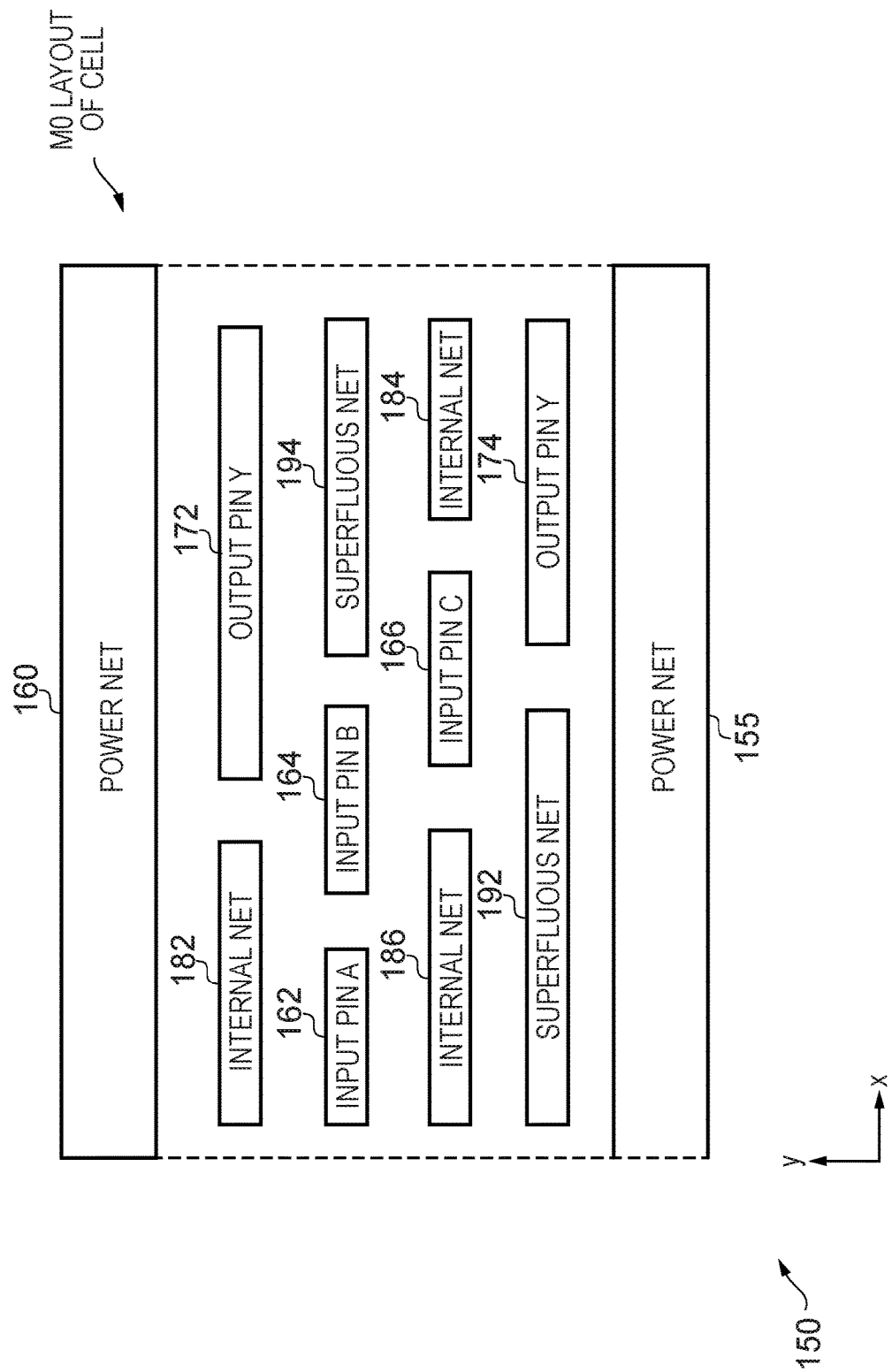
FIG. 4 is a diagram schematically illustrating the various metal sections that may be provided within the metal zero (M0) layout of a cell in one embodiment.

FIG. 4 is a diagram schematically illustrating metal sections that may be provided within the M0 layer layout of a cell 150 in accordance with one embodiment. In this example, it is assumed that the design rules imposed require the metal sections in the M0 layer to follow a regular grid and to fully occupy the assigned tracks of the grid, other than where cuts are required to isolate the different metal sections. As shown in FIG. 4, all of the metal sections extend in the x dimension, with the power net sections 155, 160 extending across the entire width of the cell. This ensures that when the cells are placed in an arrangement such as that illustrated in FIG. 2, the power nets can extend across the entire length of the standard cell rows.

As also shown in FIG. 4, additional metal sections are provided between the two power nets. The only empty space within the M0 layout is the isolation spacing between the various sections imposed by the design rules. As can be seen, this isolation spacing includes spacing at the extremity of the cell so as to isolate the various metal sections from metal sections in an adjacent cell. Further, there are spacings to isolate metals sections within the cell from one another as required so as to enable different metal sections to be associated with different functions. For example, multiple of the metal sections 162, 164, 166 can be used as input pins, and routing paths will be provided to those input pins in order to provide input signals to those various input pins. Similarly, one or more of the metal sections 172, 174 can be associated with output pins, and again will have routing paths connected to them by the place and route tool in order to transfer the output signals from the cell to appropriate locations with the circuit block, for example to provide inputs to one or more other cells.

As also shown in FIG. 4, one or more of the metal sections 182, 184, 186 may represent internal nets, which as discussed earlier are used to interconnect internal components within the cell, but are not used for connection to routing paths, and indeed must remain isolated from such routing paths.

Figure 5:
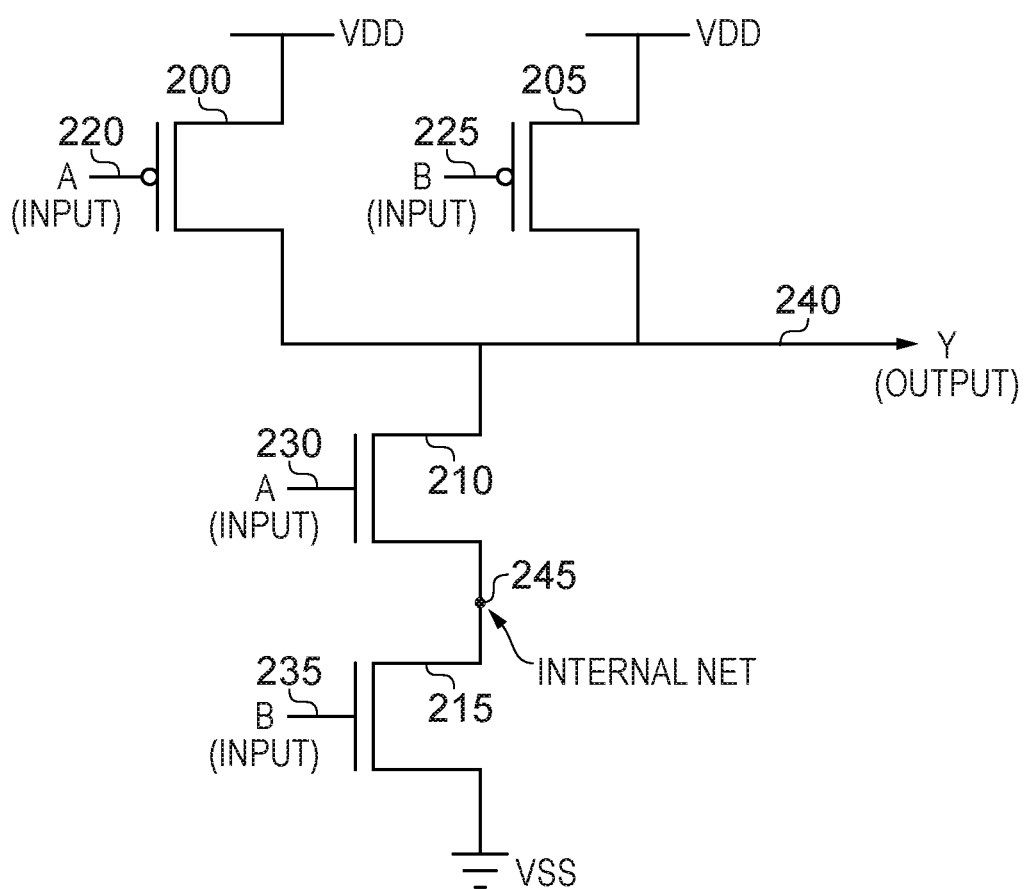
FIG. 5 illustrates input pins, output pins and internal nets for the example circuit element of a NAND gate.

An example of how the various input pins, output pins, and internal nets may be used is illustrated schematically in FIG. 5 with reference to the specific example of a NAND gate. The NAND gate consists of two PMOS transistors 200, 205 connected in parallel between a supply voltage and the output node 240, and two NMOS transistors 210, 215 arranged in series between the output path 240 and a ground voltage supply VSS. Four input nodes 220, 225, 230, 235 are shown, and the nodes 220, 230 may share one input pin within the M0 layout, whilst similarly the two input nodes 225, 235 may share the same input node. The output node 240 will be connected to an output pin within the M0 layout. The interconnection 245 between the two NMOS transistors 210, 215 represents an internal node that will be connected to one of the internal nets within the M0 layout.

Within any particular cell layout design, not all of the metal sections provided to conform to the design rules will need to be used as input pins, output pins or internal nets. These metal sections hence form superfluous metal sections, also referred to herein as superfluous nets, examples of which are denoted by the reference numerals 192, 194 in FIG. 4. In accordance with known place and route mechanisms, such superfluous nets 192, 194 will be ignored by the place and route tool, and those metal structures will be left in an electrically floating state within the manufactured circuit block.

Returning to FIG. 1, in accordance with the described embodiments each cell within the cell library 20, 25 will have associated cell definition data. As shown in FIG. 1, when the place and route tool 35 is performing its place and route operations, it has access to the information about the required cells from the cell library 20, 25, and that information will include the cell definition data.

Figure 6:
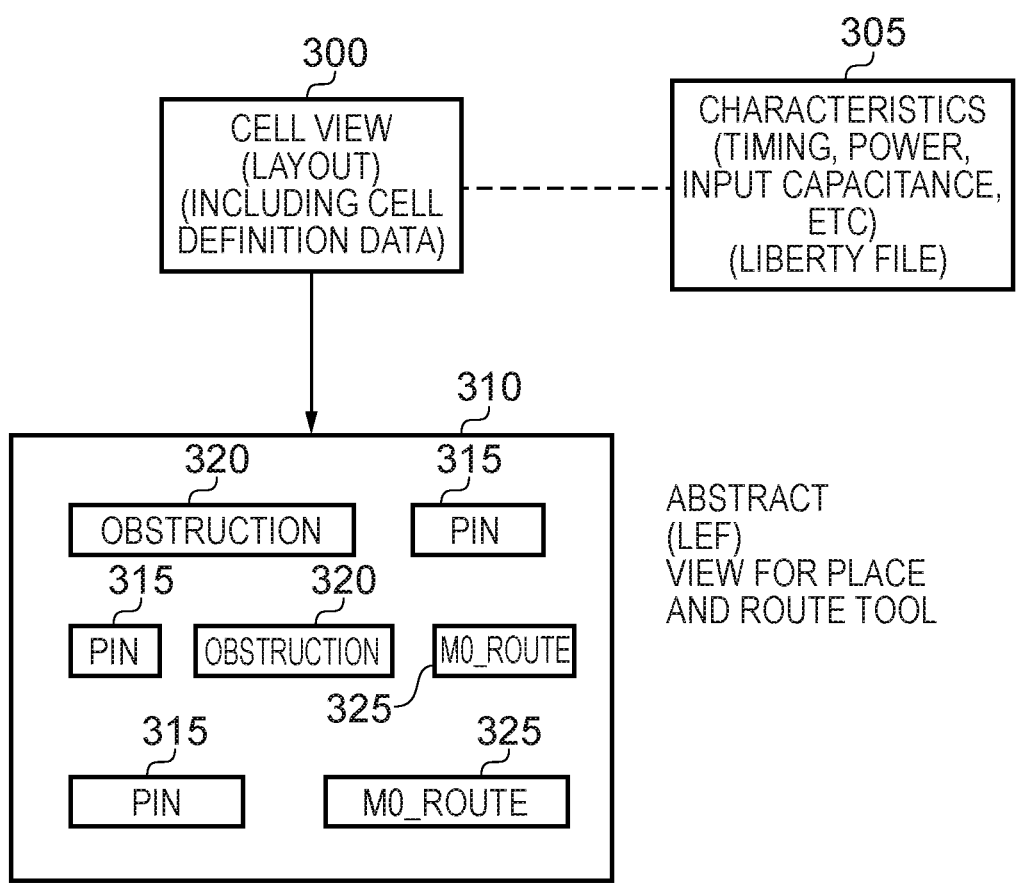
FIG. 6 illustrates various views of a cell that may be provided by the cell library in accordance with one embodiment.

There are a number of ways in which this information and cell definition data can be made available to the place and route tool, but one mechanism is illustrated in FIG. 6. In particular, within the cell library each cell may include a cell view 300 that provides all of the detail of the layout of the cell, and separately may provide information about a variety of characteristics of the cell, such as timing, power consumption, input capacitance, etc. In one embodiment all of these characteristics are specified within a specific file 305, which in some embodiments is referred to as a liberty file. The cell layout view 300 will include all of the detail of the cell, and accordingly will include the cell definition data.

However, the place and route tool 35 does not need all of the detail of the cell view 300, but instead only needs an abstract view providing the salient information required by the place and route tool in order to discern how to construct the routing paths between the cells. An example of this abstract view 310 is shown in FIG. 6, and is also sometimes referred to as a LEF (Library Exchange Format) view. In a standard abstract view of a cell, each of the metal structures provided by the cell will be identified as either being pins 315 or obstructions 320. The pins are those metal sections used to provide inputs to the cell or outputs from the cell, and accordingly are metal structures which need to be connected to by the routing paths determined by the place and route tool. The obstructions 320 are those metal sections which should remain isolated from the routing paths produced by the place and route tool. For example, the internal nets will be identified as obstructions 320 within the abstract view 310.

The abstract view 310 will hence categorise each metal section as being a pin, an obstruction, or a superfluous metal section. The abstract view will also capture the metal layer or layers within which those various structures reside.

Figure 7:
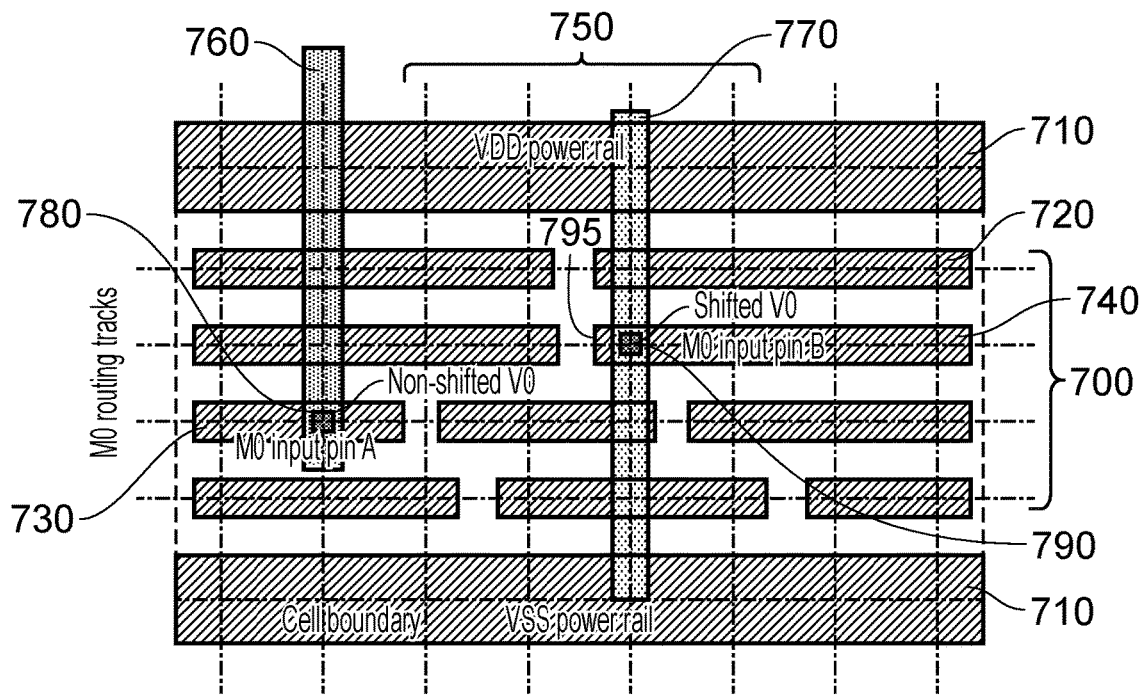
FIG. 7 schematically illustrates interconnections on a second metal layer M1.

FIG. 7 schematically illustrates an integrated circuit layout generated by the arrangement of FIG. 1 comprising a lowest (M0) layer having (as drawn in plan view) horizontal elongate formations within the metal layer arranged on a grid 700 of available locations in the vertical direction. The M0 formations include power rails 710 and other connections 720 including interface terminals such as so-called input pins 730, 740.

In the M1 layer, elongate formations within the metal layer are provided in a vertical (as drawn) direction according to a grid 750 of available horizontal locations for the vertical formations. In the example shown, M1 formations 760, 770 provide connections to the M0 input pins 730, 740. This is achieved by the M1 connections overlying the respective M0 input pins and vias 780, 790 being formed using the layer V0 120 of FIG. 3 to link the M0 formation and the M1 formation at that point. In these examples, at least a part of the interconnection is provided in a second-lowest metal layer (M1) overlying the lowest metal layer. In other examples, higher layers such as M2 could be used, in which case at least a part of the interconnection is provided in another of the further metal layers overlying the second-lowest metal layer.

The input pins provide examples of interface terminals comprising input terminals and output terminals. For a group of two or more cells, a routing path may be between at least one input terminal and at least one output terminal.

The via 780 is arranged at the intersection of the relevant lines of the grid 700 and the grid 750, which is to say horizontally centrally with respect to the formation 760 and vertically central with respect to the formation 730.

Regarding the via 790, this is shifted to the right with respect to the longitudinal vertical axis of the M1 formation 770. This is to comply with a design constraint that a via cannot be closer than a threshold minimum separation from the edge 795 of the M0 formation. This provides an example in which the interface terminals in the lowest metal layer are elongate regions subject to a design constraint imposing a minimum separation of a via connection from an end of one of the elongate regions; interconnections within the second-lowest metal layer are elongate regions; the elongate regions in the first metal layer and the second-lowest metal layer are in orthogonal directions; and the providing step comprises providing a via connection offset from a central longitudinal axis of an interconnection in the second-lowest metal layer so as not to violate the design constraint.

Figure 8:
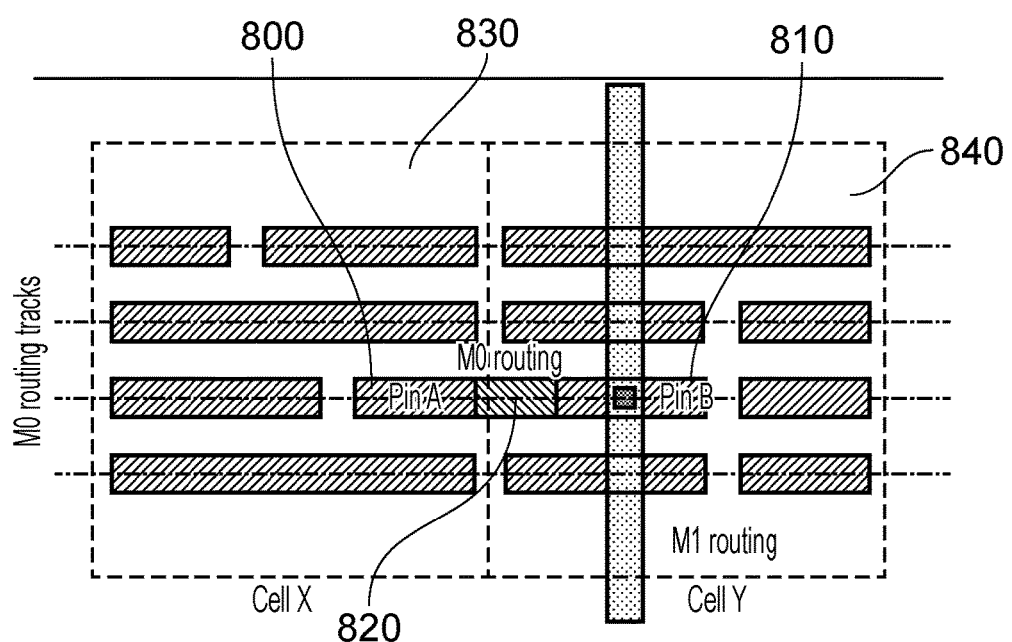
FIG. 8 schematically illustrates interconnections on a lowest metal layer M0.

Another technique for providing an interconnection between interface terminals in the M0 layer such as interface terminals 800, 810 in FIG. 8 is to insert a linking portion 820 in the M0 layer. The linking portion or interconnection 820 can comprise an elongate region in the M0 layer between an interface terminal 800 at a lateral edge (in the horizontal direction as drawn) of a cell 830 and an interface terminal 810 at a lateral edge (again in the horizontal direction as drawn) of a next adjacent cell 840.

Note that normally, the design constraints applicable to cells are such that at the lateral edges of a cell the conducting regions formed in the M0 layer are terminated by a gap. Therefore, the present arrangements break this constraint and allow connections in the M0 layer between adjacent edges of cells.

Figure 9:
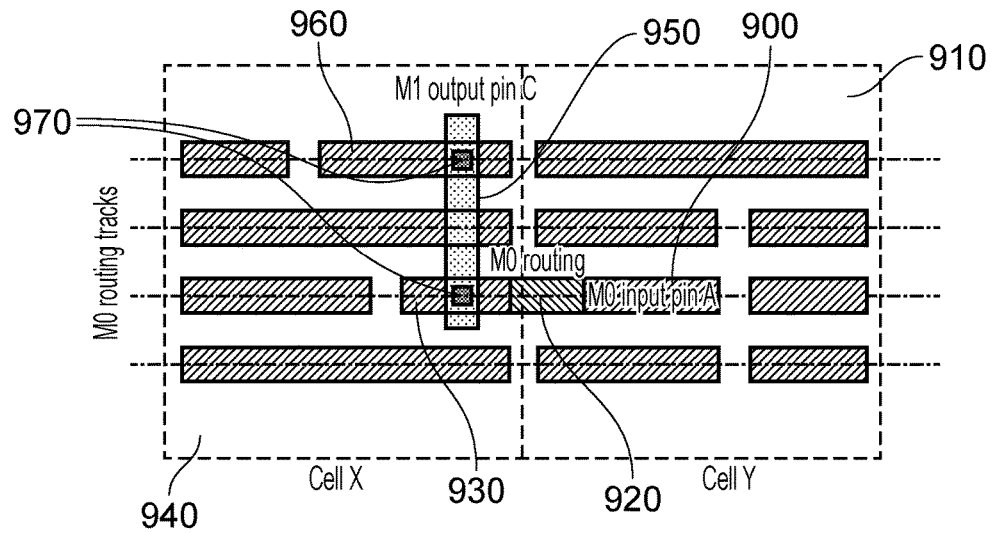
FIGS. 9 and 10 schematically illustrate M1 and M0 layer interconnections.

FIG. 9 schematically illustrates an arrangement combining the techniques described with reference to FIGS. 7 and 8, in that an interface terminal 900 in a cell 910 is connected by an interconnection 920 to an adjacent portion 930 in the next adjacent cell 940. The portion 930 is in turn connected by an M1 layer interconnection 950 to an interface terminal 960 in the cell 940. Once again, vias 970 are provided between the M0 layer and M1 layer conductors.

Figure 10:
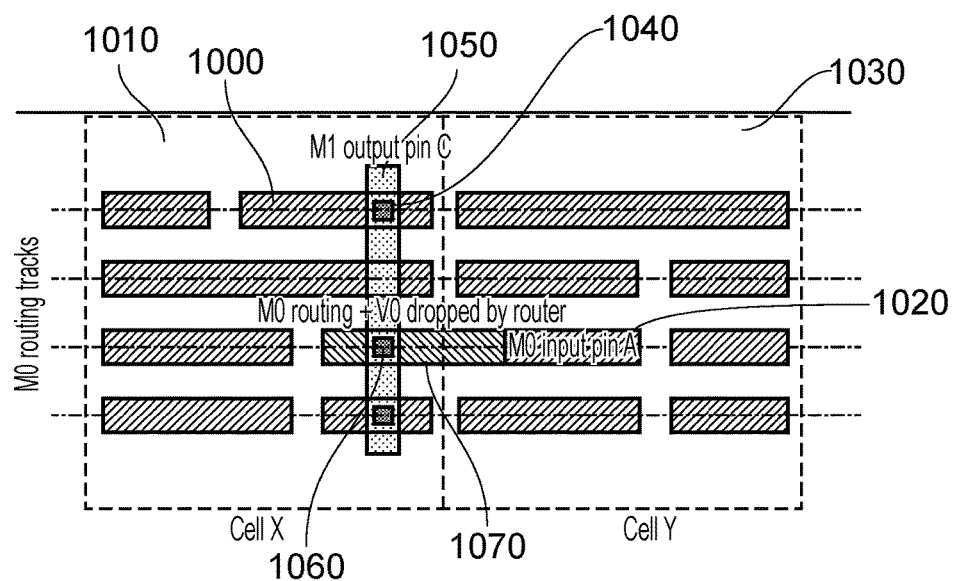

FIG. 10 schematically illustrates another example in which an interface terminal 1000 of a cell 1010 is connected to an interface terminal 1020 of a next adjacent cell 1030 by means of a via 1040, an M1 layer formation 1050 and another via 1060. Here, enough empty space is reserved within the cell to isolate the M0 layer interconnection 1070 between the via 1060 and the interface terminal 1020. In this context a via dropped by the router includes a connection within the layer V0 and small portions of M0 and M1 overlapping the V0 area. Then the layout of the cell should ensure there is enough space for the small M0 piece which cannot touch any M0 part of the cell to avoid short circuits. The small M0 piece attached to V0 from the router is part of the section 1070 in the drawing.

Figure 11:
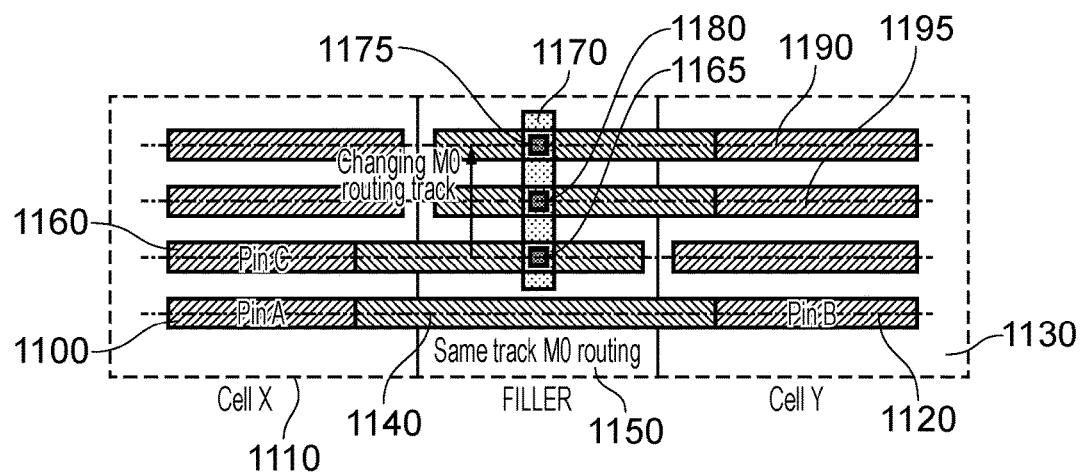
FIGS. 11 and 12 schematically illustrate the use of a filler cell.

FIG. 11 schematically illustrates an arrangement using a so-called filler cell. Filler cells are used to add spacing between active functional cells to facilitate placement and routing of the circuit block. They provide a significant M0 routing resource, given that the M0 layer must be filled everywhere according to the design rules. In FIG. 11, an interface terminal 1100 of a cell 1110 is connected to an interface terminal 1120 of a next adjacent functional cell 1130 via an M0 layer track 1140 through a filler cell 1150. Similarly, an interface terminal 1160 is connected by means of a via 1165, an M1 interconnection 1170 and vias 1175, 1180 to two other tracks 1190, 1195 in the cell 1130.

The use of the filler cell 1150 provides an example in which the plurality of candidate cells comprises at last one filler cell providing cell spacing and at least power rail continuity, the filler cell defining elongate filler regions in the lowest metal layer in the predetermined orientation; in which the step of determining routing paths comprises providing, in the generated layout, an interconnection within the lowest metal layer between the interface terminals and one or more elongate filler region of an intervening filler cell.

In some examples, for a routing path between interface terminals of a pair of cells, the step of determining routing paths comprises: providing, in the generated layout, an interconnection within the lowest metal layer M0 between an interface terminal 1160 of one of the pair of cells and a first one of the one or more elongate filler region of an intervening filler cell within the lowest metal layer; providing, in the generated layout, an interconnection within the lowest metal layer between an interface terminal 1190 of the other of the pair of cells and a second, different, one of the one or more elongate filler region of the intervening filler cell within the lowest metal layer; and providing, in the generated layout, an interconnection 1170 within another metal layer other than the lowest metal layer between the first and second elongate filler regions.

Figure 12:
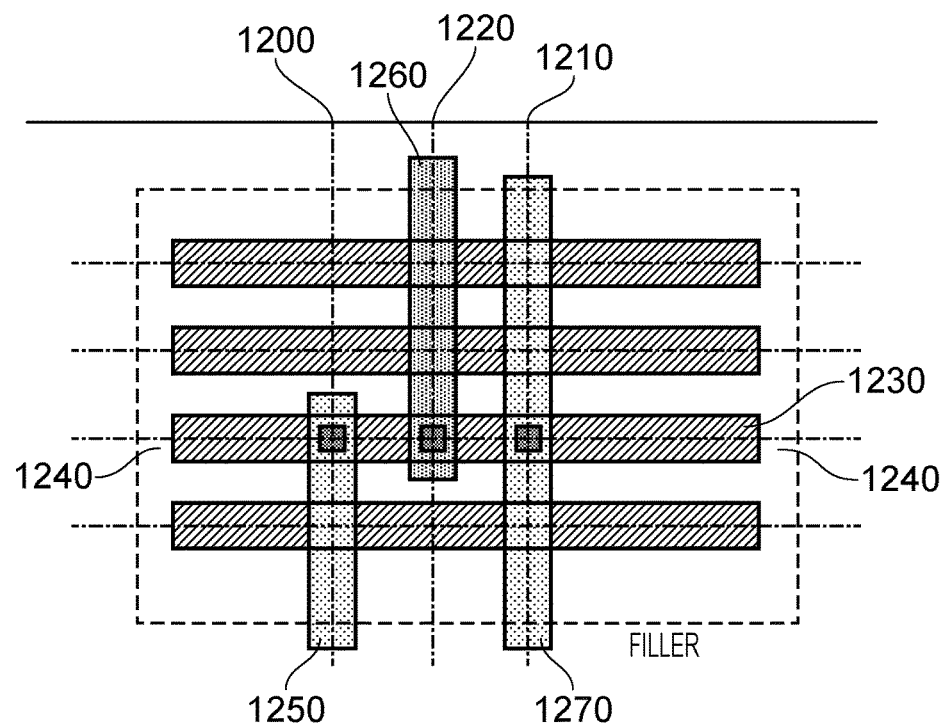

FIG. 12 schematically illustrates an arrangement to change an M1 level routing track.

As background, the layout process discussed here involves preparing two or more fabrication mask patterns which are spatially offset with respect to one another.

Referring back to the grids 700, 750 of FIG. 7, in the M1 layer and higher, alternate grid positions are fabricated according to each of the masks.

Referring to FIG. 12, the grid positions 1200, 1210 are fabricated using one mask and the grid position 1220 is fabricated using another mask. In case of a need to change between the masks during the placing and routing process, a conductor 1230 in the M0 layer of a filler cell, isolated from adjacent cells by gaps 1240, can be used to link to interconnections 1250, 1260, 1270 in the M1 layer. For example, as between the connections 1250, 1260 this can provide an interchange between fabrication using each of the two masks.

M0 routing between the cells can be further improved by providing or implementing multiple versions of the same cell using electrical equivalence (EEQ) between the different versions of the cell. In such arrangements, the plurality of candidate cells comprises one or more groups of electrically equivalent candidate cells, in which, for a group of electrically equivalent candidate cells the circuit functionality is the same but the layout of interface terminals differs between the electrically equivalent candidate cells. As discussed below, the step of determining a set of cells can comprise selecting, for a given cell having a required cell functionality, one of a group of electrically equivalent cells providing that required cell functionality taking into account the routing of a routing path between interface terminals of the given cell and one or more other cells.

Figure 13:
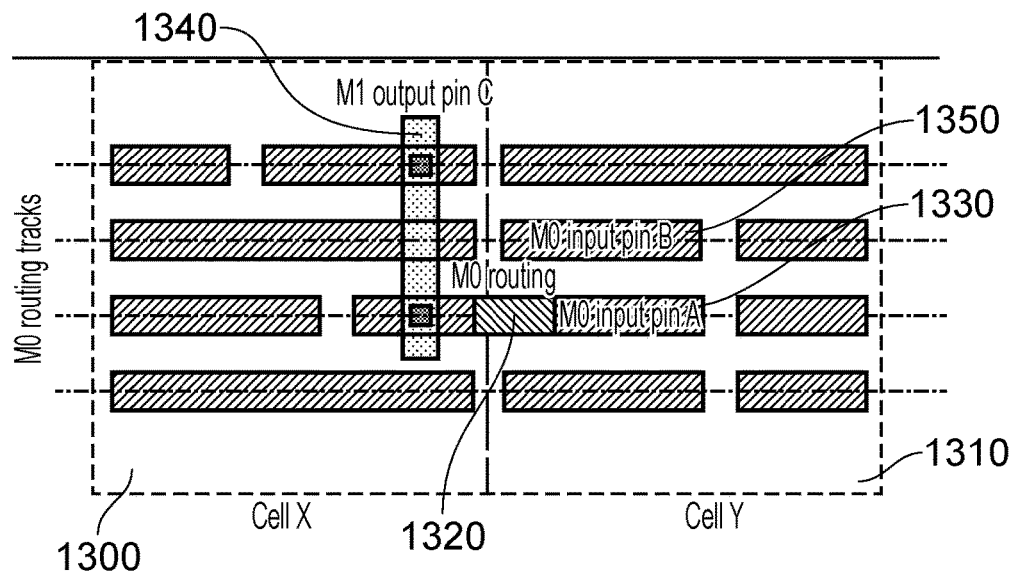
FIGS. 13 to 15 schematically illustrate the use of an electrically equivalent cell.

FIG. 13 shows an example of two cells 1300, 1310 (cells X, Y) using an M0 layer interconnection 1320 forming part of the interconnection from the M0 input pin A 1330 to an output pin C 1340 in the M1 layer. Another input pin B 1350 of the cell Y 1310 is shown unconnected in this example.

Figure 14:
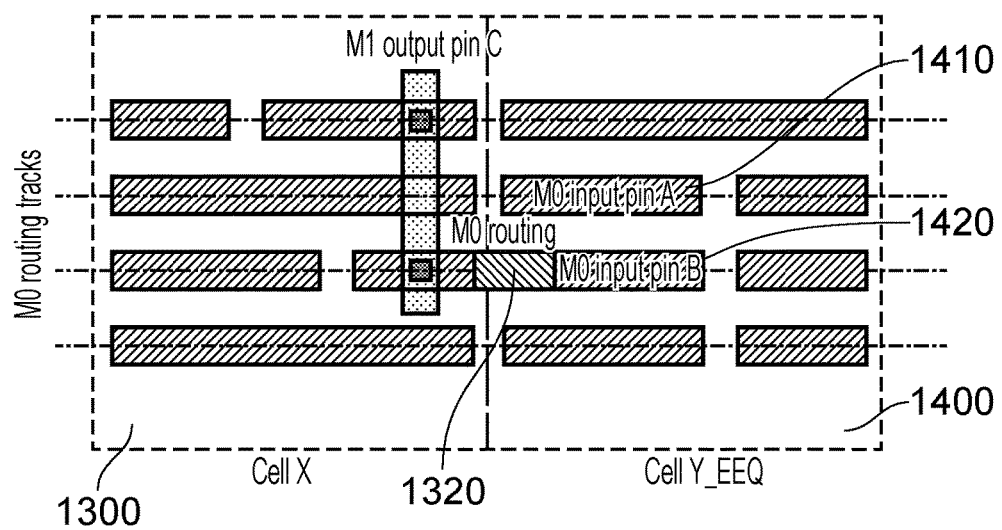

FIG. 14 shows the same cell X 1300 but an electrically equivalent (EEQ) version 1400 of the cell Y, in which the positions of the two input pins A and B 1410, 1420 have been interchanged. Here, the same M0 routing portion 1320 can be used but this time to connect the M0 input pin B to the M1 output pin C. In forming the circuitry layout, the place and routing tool will select either the version 1310 of the cell Y or the electrically equivalent version 1400 of the cell Y.

The use of the region 1320 provides an example in which the interface terminals in the lowest metal layer are elongate regions in a predetermined orientation, and the interconnection comprises an elongate region in the lowest metal layer between an interface terminal at a lateral edge, with respect to the predetermined orientation, of a cell and an interface terminal at a lateral edge of a next-adjacent cell.

Figure 15:
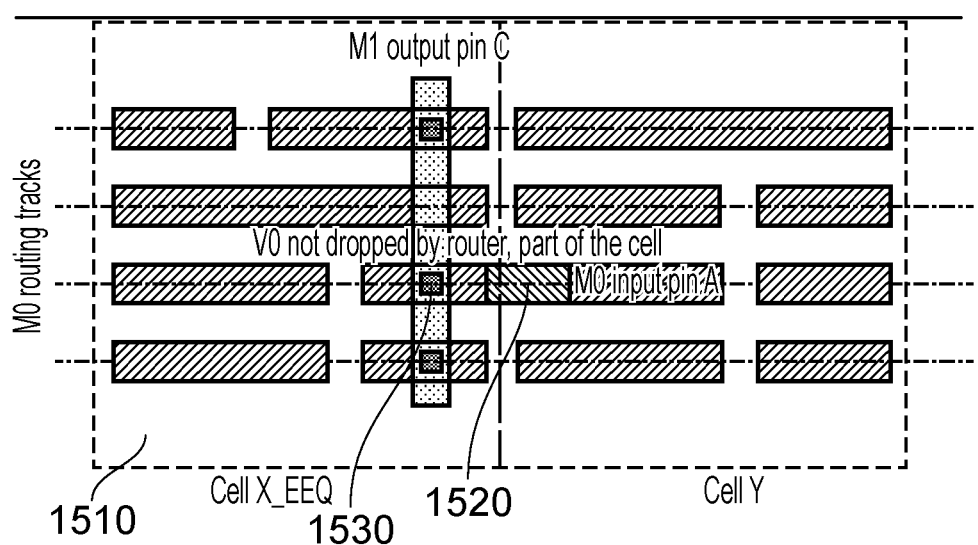

In FIG. 10 discussed above, it was assumed that the router had the capability to connect an M1 layer conductor with the via layer V0 and then route with M0. However, some routers only connect from the top of the metal and not from the bottom, bearing in mind that V0 is below M1 in FIG. 3. In this case, problems can be avoided by using an electrically equivalent version of the cell 1010, a cell 1510 in FIG. 15, and including a portion 1520 in the M0 layer added by the router and a via 1530 (including a portion in the layer V0 and a small piece of M0 attached to it) forming part of the cell design of the electrically equivalent cell 1510.

Figure 16:
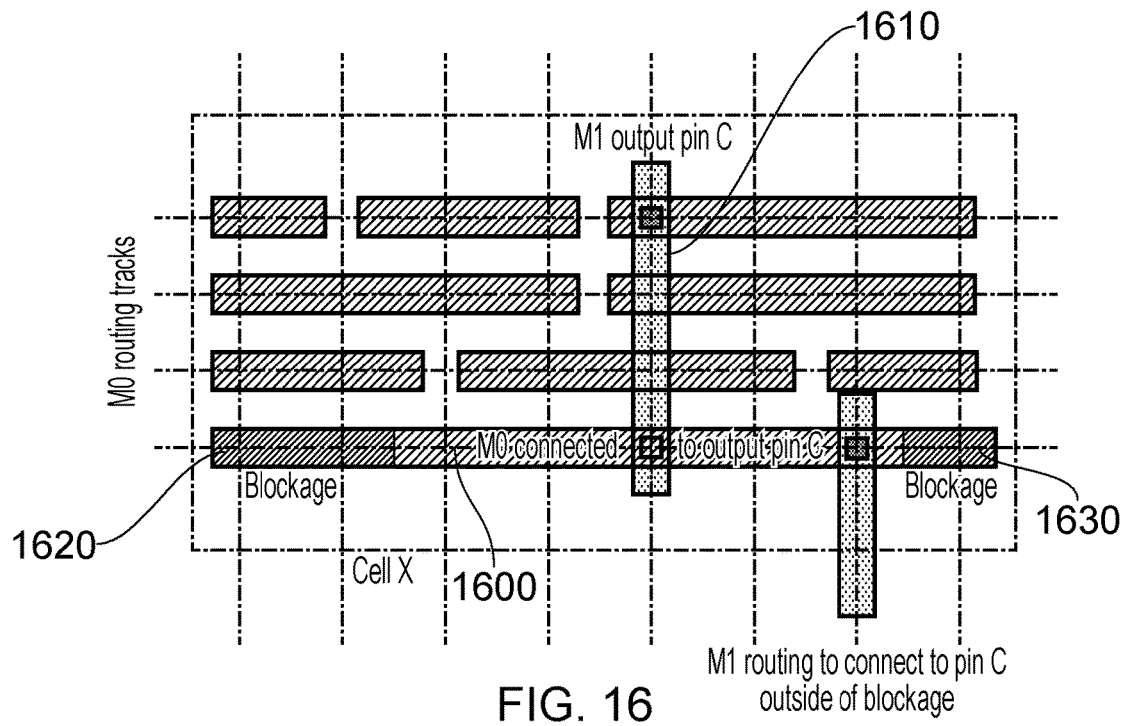
FIG. 16 schematically illustrates the use of blockage regions.

Referring to FIG. 16, in some cases the M0 portion 1600 connected to an M1 portion 1610 may extend (laterally as drawn) far from the M1 portion 1610. In this case, a so-called blockage region 1620, 1630 can be added in order to avoid the router connecting too far from the M1 shape, so as to minimise or reduce the additional resistance between the routed point and the M1 shape 1610.

The use of the blockage region 1620, 1630 provides an example in which the step of determining routing paths comprises determining a routing path between interface terminals of a group of two or more cells by providing, in the generated layout, (i) an interconnection overlying an interface terminal of the group of two or more cells in one of the one or more further metal layers (ii) a via connection between the interconnection and the interface terminals of the group of two or more cells; and (iii) one or more inhibited regions 1620, 1630 spatially separated from the interconnection in which the routing of connections to the interface terminal is inhibited.

FIGS. 17-20 deal with arrangements to allocate cells and portions of cells between the spatially offset masks. As mentioned above, each M1 and M2 routing track is allocated to one or other of the spatially offset masks, such that a next-adjacent routing track is allocated to the other of the two masks. The mask allocation is the same every alternate routing track. The cells in the cell library in turn have conductive portions allocated to routing tracks. This allocation should match the grid associated with the substrate when the cells are placed in a circuit block floorplan. In the case of a discrepancy, the present arrangements provide a second version of the same cell inverting the allocation of masks to each conductive formation in a cell. The router will pick either the original version of the cell or the inverted version to allow placement at an arbitrary position in the layout.

This provides an example in which a given candidate cell defines respective cell formations within a plurality of metal layers for fabrication using two spatially offset mask patterns.

Figure 17:
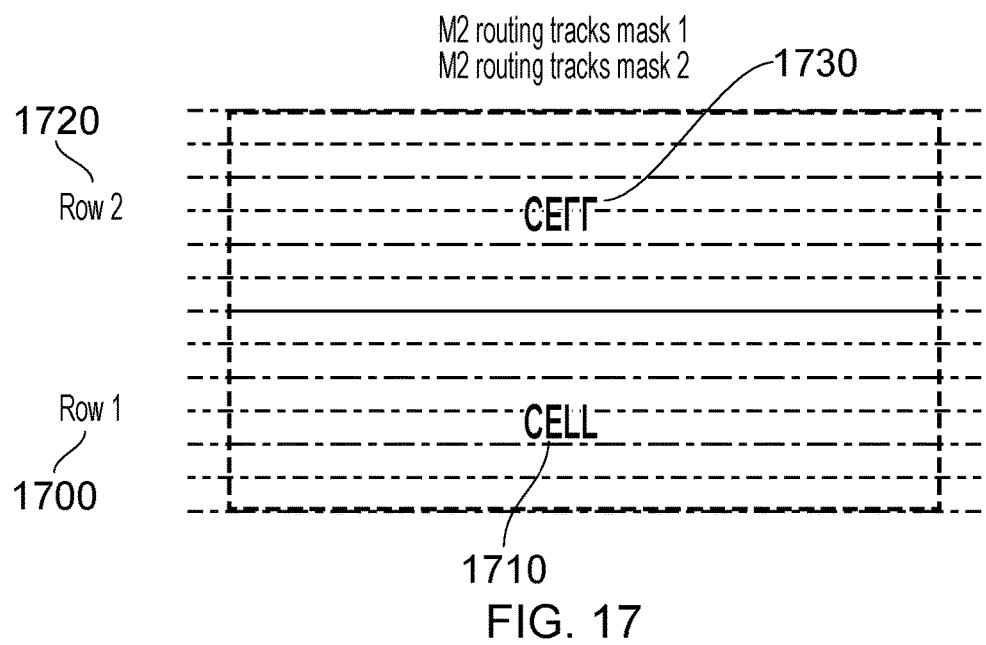
FIG. 17 schematically illustrates two rows of cells.

Turning to FIG. 17, cells are generally vertically inverted when they are placed in adjacent rows. In FIG. 17 a first row 1700 has cells in a first orientation 1710 and a next adjacent row 1720 has cells in a vertically inverted orientation 1730. When the M2 placement grid matches the cell height as illustrated in FIG. 17, there is no mask conflict regarding the M2 layer.

Figure 18:
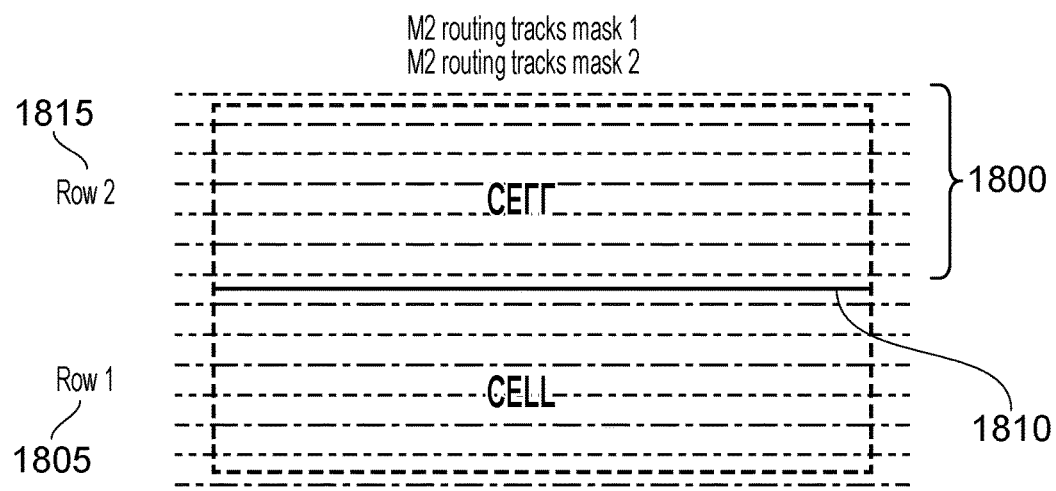
FIG. 18 schematically illustrates two rows of cells with offset M2 routing tracks.

In FIG. 18, the M2 routing grid 1800 applicable to both rows is offset from the cell row boundary 1810. In this case, the mask allocation of the M2 shapes within the cells may match M2 routing track mask allocation for the first row 1805 but not the second row 1815 of cells. Embodiments of the present disclosure provide a second version of the same cells, inverting the mask allocation of each M2 shape. So, one version of the cells would be used for the row 1805 and alternate rows from there, and the inverted version would be used for the row 1815 and alternate rows from there. This provides an example, for a given candidate cell, of generating an electrically equivalent candidate cell by interchanging the mask patterns applicable to respective cell formations. The inverted versions can be generated as required, or alternatively the plurality of candidate cells can comprise one or more groups of the electrically equivalent candidate cells.

Combining these different possibilities, four different versions of the cell may be provided or obtained.
CELL: original cell
CELL_M1: M1 mask allocation inverted
CELL_M2: M2 mask allocation inverted
CELL_M1_M2: M1 and M2 mask allocations inverted.

FIG. 19 schematically illustrates cell placement in an example logic block accounting for the different mask allocation variants of the cells.

Figure 20:
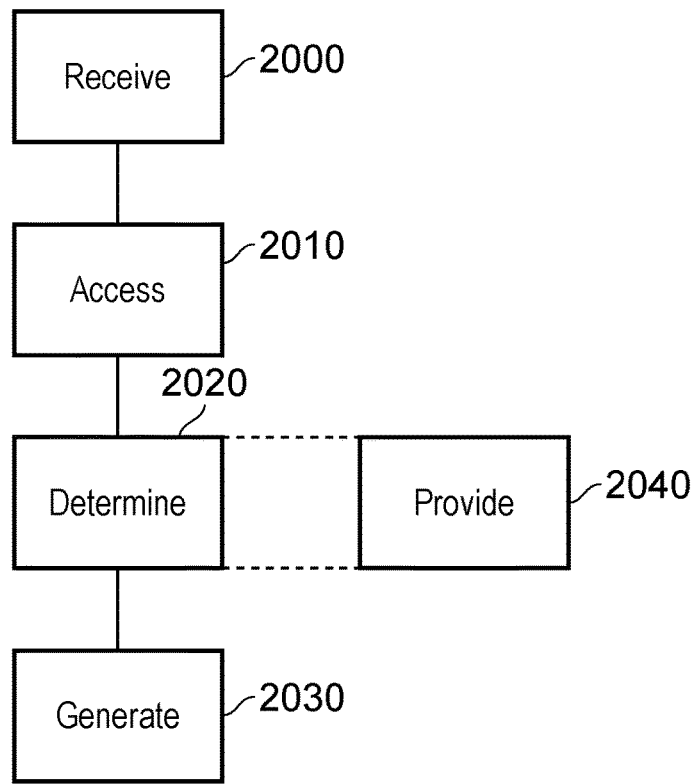
FIGS. 20 and 21 are schematic flowcharts illustrating respective methods.

FIG. 20 is a schematic flowchart illustrating a computer-implemented method of generating a layout of a circuit block of an integrated circuit, comprising:

receiving (at a step 2000) input data defining a logical operation of the circuit block;

accessing (at a step 2010) a cell library providing a plurality of candidate cells;

determining (at a step 2020), with reference to the input data, a set of cells to be used to implement the circuit block, the cells defining circuit elements for fabrication on a substrate; and generating (at a step 2030) the layout by employing a place and route tool to determine a placement of the set of cells and performing a routing operation to interconnect interface terminals of the set of cells by determining routing paths to be provided within a plurality of metal layers including a lowest metal layer overlying the cells and within which interface terminals of the cells are provided and one or more further metal layers overlying the lowest metal layer;

in which the step of determining routing paths comprises determining (at a step 2040) a routing path between interface terminals of a group of two or more cells by providing (at a step 2040), in the generated layout, (i) an interconnection overlying the interface terminals of the group of two or more cells in one of the one or more further metal layers and (ii) via connections between the interconnection and the interface terminals of the group of two or more cells.

Figure 21:
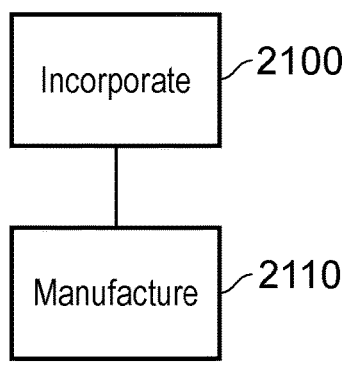

FIG. 21 is a schematic flowchart illustrating a method (which can follow any of these methods) comprising the steps of: incorporating (at a step 2100) the layout of the circuit block within a layout of an integrated circuit; and manufacturing (at a step 2110) the integrated circuit from the layout of the integrated circuit. In this regard, any of FIGS. 7 to 19 can be considered as schematic representations of an integrated circuit manufactured according to the method of FIG. 21.

Figure 22:
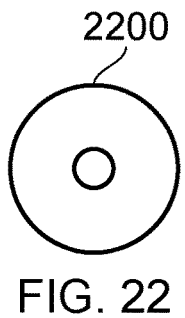
FIGS. 22 and 23 schematically illustrate non-transitory machine-readable storage media.
Figure 23:
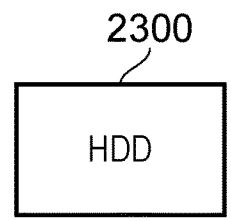

The cell library can be provided by a non-transitory machine-readable storage medium such as an optical disc medium 2200 (FIG. 22) or a hard disk medium 2300 (FIG. 23). These provide examples of a non-transitory storage medium storing a cell library comprising a plurality of candidate cells that define circuit elements, the cell library providing one or more groups of electrically equivalent candidate cells in which, for a group of electrically equivalent cells, the circuit functionality is the same but the layout of interface terminals differs between the electrically equivalent cells. These also provide examples of a non-transitory storage medium storing a cell library comprising a plurality of candidate cells that define circuit elements, the cell library providing one or more groups of electrically equivalent candidate cells in which, for a group of electrically equivalent cells, the circuit functionality is the same but the respective cell formations are interchanged amongst at least two spatially offset mask patterns.

Figure 24:
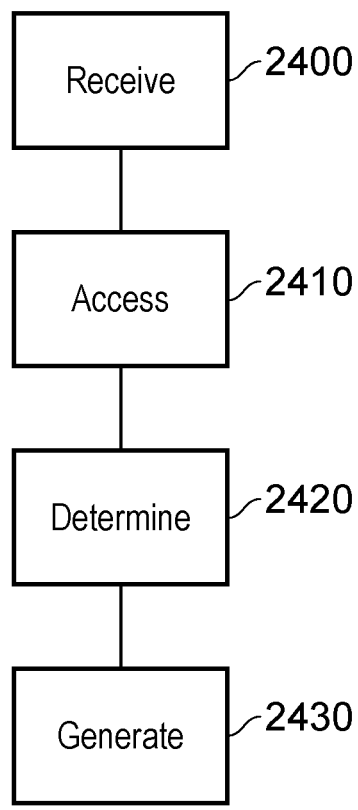
FIGS. 24 to 26 are schematic flowcharts illustrating respective methods.

FIG. 24 is a schematic flowchart illustrating a computer-implemented method of generating a layout of a circuit block of an integrated circuit, comprising:

receiving (at a step 2400) input data defining a logical operation of the circuit block;

accessing (at a step 2410) a cell library providing a plurality of candidate cells;

determining (at a step 2420), with reference to the input data, a set of cells to be used to implement the circuit block, the cells defining circuit elements for fabrication on a substrate; and generating (2430) the layout by employing a place and route tool to determine a placement of the set of cells and performing a routing operation to interconnect interface terminals of the set of cells by determining routing paths to be provided within a plurality of metal layers including a lowest metal layer overlying the cells and within which interface terminals of the cells are provided and one or more further metal layers overlying the lowest metal layer;

in which the step of determining routing paths comprises determining a routing path between interface terminals of a group of two or more cells by providing, in the generated layout, an interconnection between the interface terminals within the lowest metal layer.

Figure 25:
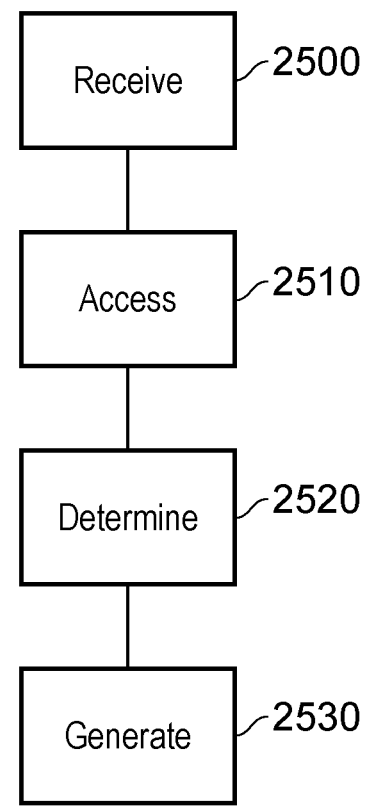

FIG. 25 is a schematic flowchart illustrating a computer-implemented method of generating a layout of a circuit block of an integrated circuit, comprising:

receiving (at a step 2500) input data defining a logical operation of the circuit block;

accessing (at a step 2510) a cell library providing a plurality of candidate cells, each cell having an associated representation defining respective cell formations within respective ones of a plurality of metal layers for fabrication using at least two spatially offset mask patterns;

determining (at a step 2520), with reference to the input data, a set of cells to be used to implement the circuit block, the cells defining circuit elements for fabrication on a substrate, the set of cells comprising at least two rows of cells in which cells in a row of cells are spatially inverted relative to cells in an adjacent row of cells; and generating (at a step 2530) the layout by employing a place and route tool to determine a placement of the set of cells;

in which:

the generating step comprises generating a layout in which the spatially offset mask patterns are aligned with a routing grid defined with respect to the substrate; and the step of determining a set of cells comprises selecting, amongst groups of electrically equivalent candidate cells in which, for a group of electrically equivalent cells, the circuit functionality is the same but the respective cell formations are interchanged amongst the at least two spatially offset mask patterns.

Figure 26:
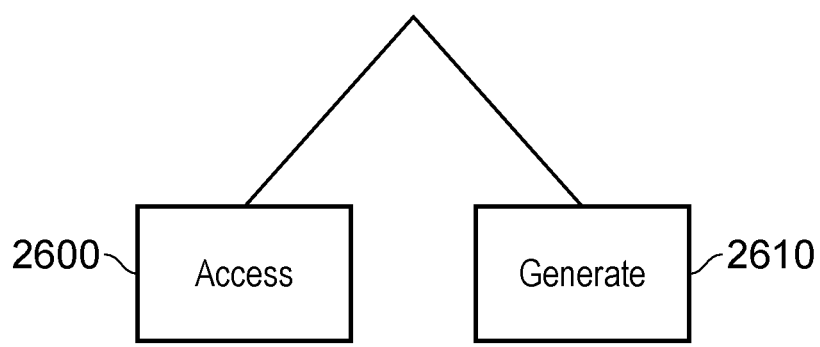

In terms of obtaining the electrically equivalent cells, these may be present in the library (in which case, in FIG. 26, the step of determining comprises accessing (at a step 2600) the EEQ cells in the library) or they may be generated as needed, in which case the step of determining comprises, for a given candidate cell, generating (at a step 2610) an electrically equivalent candidate cell by interchanging the mask patterns applicable to respective cell formations.

Figure 27:
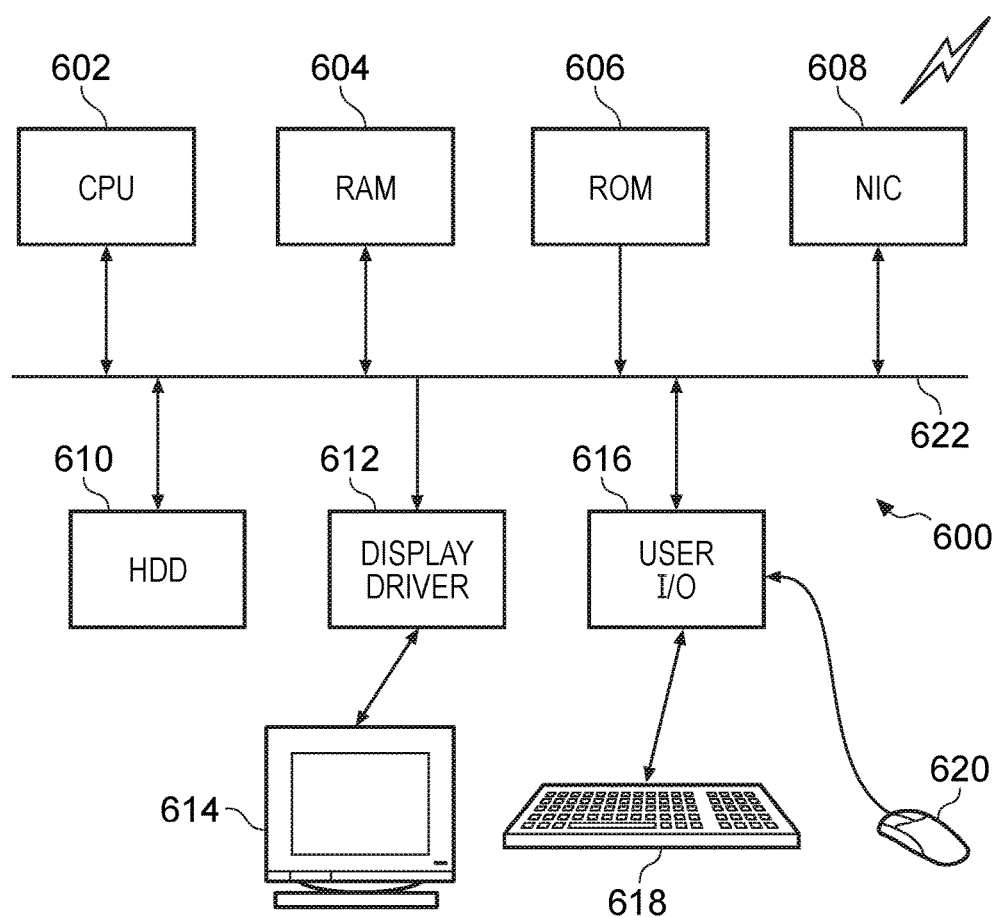
FIG. 27 schematically illustrates a data processing system.

FIG. 27 schematically illustrates a general purpose computer 600 of the type that may be used to implement the techniques described above, and in particular the generation of a layout of a circuit block for an integrated circuit. The general purpose computer 600 includes a central processing unit 602, a random access memory 604, a read-only memory 606, a network interface card 608, a hard disk drive 610, a display driver 612 and monitor 614, and a user input/output circuit 616 with a keyboard 618 and mouse 620 all connected via a common bus 622. In operation the central processing unit 602 will execute computer program instructions that may be stored in one or more of the random access memory 604, the read-only memory 606 and the hard disk drive 610, or dynamically downloaded via the network interface card 608. The results of the processing performed may be displayed to a user via the display driver 612 and the monitor 614. User inputs for controlling the operation of the general purpose computer 600 may be received via the user input/output circuit 616 from the keyboard 618 or the mouse 620. It will be appreciated that the computer program could be written in a variety of different computer languages. The computer program may be stored and distributed on a recording medium or dynamically downloaded to the general purpose computer 600. When operating under control of an appropriate computer program, the general purpose computer 600 can perform the above described layout generation techniques and can be considered to form an apparatus for performing the above described techniques, and a computer program stored by the HDD 610 and/or the ROM 606 can provide an example of a computer program product on a non-transitory storage medium for controlling a computer to perform a method of generating a layout of a circuit block as discussed above. The architecture of the general purpose computer could vary considerably, and FIG. 27 is only one example. As discussed above, the candidate cell library may be provided by a non-transitory machine-readable storage medium and in the context of FIG. 27, the ROM 606 and HDD 610 are examples of this.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

The invention claimed is:

1. A computer-implemented method of generating a layout of a circuit block of an integrated circuit, comprising:
receiving input data defining a logical operation of the circuit block;
accessing a cell library providing a plurality of candidate cells;
determining, with reference to the input data, a set of cells to be used to implement the circuit block, the cells defining circuit elements for fabrication on a substrate; and
generating the layout by employing a place and route tool to determine a placement of the set of cells and performing a routing operation to interconnect interface terminals of the set of cells by determining routing paths to be provided within a plurality of metal layers including a lowest metal layer overlying the cells and within which interface terminals of the cells are provided and one or more further metal layers overlying the lowest metal layer;
in which:
the step of determining routing paths comprises determining a routing path between interface terminals of a group of two or more cells by providing, in the generated layout, (i) an interconnection overlying the interface terminals of the group of two or more cells in one of the one or more further metal layers and (ii) via connections between the interconnection and the interface terminals of the group of two or more cells;
the interface terminals in the lowest metal layer are elongate regions subject to a design constraint imposing a minimum separation of a via connection from an end of one of the elongate regions;
interconnections within the second-lowest metal layer are elongate regions;
the elongate regions in the first metal layer and the second-lowest metal layer are in orthogonal directions; and
the providing step comprises providing a via connection offset from a central longitudinal axis of an interconnection in the second-lowest metal layer so as not to violate the design constraint.

2. A method according to claim 1, in which the providing step comprises providing at least a part of the interconnection in a second-lowest metal layer overlying the lowest metal layer.

3. A method according to claim 2, in which the providing step comprises providing at least a part of the interconnection in another of the further metal layers overlying the second-lowest metal layer.

4. A method according to claim 1, in which:
the interface terminals comprise input terminals and output terminals; and
for the group of two or more cells, the routing path is between at least one input terminal and at least one output terminal.

5. A method according to claim 1, in which the plurality of candidate cells comprises one or more groups of electrically equivalent candidate cells in which, for a group of electrically equivalent cells, the circuit functionality is the same but the layout of interface terminals differs between the electrically equivalent cells.

6. A method according to claim 5, in which the step of determining a set of cells comprises selecting, for a given cell having a required cell functionality, one of a group of electrically equivalent cells providing that required cell functionality taking into account the routing of a routing path between interface terminals of the given cell and one or more other cells.

7. A method as claimed in claim 1, in which the lowest metal layer is a metal 0 (M0) layer.

8. A method as claimed in claim 1, further comprising the steps of:
incorporating the layout of the circuit block within a layout of an integrated circuit; and
manufacturing the integrated circuit from the layout of the integrated circuit.

9. An integrated circuit manufactured according to the method of claim 8.

10. A computer program product on a non-transitory storage medium for controlling a computer to perform a method of generating a layout of a circuit block as claimed in claim 1.

11. A computer-implemented method of generating a layout of a circuit block of an integrated circuit, comprising:
receiving input data defining a logical operation of the circuit block;
accessing a cell library providing a plurality of candidate cells;
determining, with reference to the input data, a set of cells to be used to implement the circuit block, the cells defining circuit elements for fabrication on a substrate; and
generating the layout by employing a place and route tool to determine a placement of the set of cells and performing a routing operation to interconnect interface terminals of the set of cells by determining routing paths to be provided within a plurality of metal layers including a lowest metal layer overlying the cells and within which interface terminals of the cells are provided and one or more further metal layers overlying the lowest metal layer;

in which:
the step of determining routing paths comprises determining a routing path between interface terminals of a group of two or more cells by providing, in the generated layout, an interconnection between the interface terminals within the lowest metal layer; and
the interface terminals in the lowest metal layer are elongate regions in a predetermined orientation.

12. A method according to claim 11, in which the interconnection comprises an elongate region in the lowest metal layer between an interface terminal at a lateral edge, with respect to the predetermined orientation, of a cell and an interface terminal at a lateral edge of a next-adjacent cell.

13. A method according to claim 11, in which:
the plurality of candidate cells comprises at last one filler cell providing cell spacing and at least power rail continuity, the filler cell defining elongate filler regions in the lowest metal layer in the predetermined orientation;
in which the step of determining routing paths comprises providing, in the generated layout, an interconnection within the lowest metal layer between the interface terminals and one or more elongate filler region of an intervening filler cell.

14. A method according to claim 13, in which, for a routing path between interface terminals of a pair of cells, the step of determining routing paths comprises:
providing, in the generated layout, an interconnection within the lowest metal layer between an interface terminal of one of the pair of cells and a first one of the one or more elongate filler region of an intervening filler cell within the lowest metal layer;
providing, in the generated layout, an interconnection within the lowest metal layer between an interface terminal of the other of the pair of cells and a second, different, one of the one or more elongate filler region of the intervening filler cell within the lowest metal layer; and
providing, in the generated layout, an interconnection within another metal layer other than the lowest metal layer between the first and second elongate filler regions.

15. A method according to claim 11, in which:
the interface terminals comprise input terminals and output terminals; and
for the group of two or more cells, the routing path is between at least one input terminal and at least one output terminal.

16. A method according to claim 11, in which:
the step of determining routing paths comprises determining a routing path between interface terminals of a group of two or more cells by providing, in the generated layout, (i) an interconnection overlying an interface terminal of the group of two or more cells in one of the one or more further metal layers (ii) a via connection between the interconnection and the interface terminals of the group of two or more cells; and (iii) one or more inhibited regions spatially separated from the interconnection in which the routing of connections to the interface terminal is inhibited.

17. A method as claimed in claim 11, in which the lowest metal layer is a metal 0 (M0) layer.

18. A method according to claim 11, in which the plurality of candidate cells comprises one or more groups of electrically equivalent candidate cells in which, for a group of electrically equivalent cells, the circuit functionality is the same but the layout of interface terminals differs between the electrically equivalent cells.

19. A method according to claim 18, in which the step of determining a set of cells comprises selecting, for a given cell having a required cell functionality, one of a group of electrically equivalent cells providing that required cell functionality taking into account the routing of a routing path between interface terminals of the given cell and one or more other cells.

20. A method as claimed in claim 11, further comprising the steps of:
incorporating the layout of the circuit block within a layout of an integrated circuit; and
manufacturing the integrated circuit from the layout of the integrated circuit.

21. An integrated circuit manufactured according to the method of claim 20.

22. A computer program product on a non-transitory storage medium for controlling a computer to perform a method of generating a layout of a circuit block as claimed in claim 11.

* * * * *